United States Patent
Linz

(10) Patent No.: US 6,668,356 B2
(45) Date of Patent: Dec. 23, 2003

(54) METHOD FOR DESIGNING CIRCUITS WITH SECTIONS HAVING DIFFERENT SUPPLY VOLTAGES

(75) Inventor: Stefan Linz, Sauerlach (DE)

(73) Assignee: Infineon Technologies AG, Munich (DE)

(*) Notice: Subject to any disclaimer, the term of this patent is extended or adjusted under 35 U.S.C. 154(b) by 35 days.

(21) Appl. No.: 10/040,230

(22) Filed: Jan. 4, 2002

(65) Prior Publication Data

US 2002/0124234 A1 Sep. 5, 2002

(30) Foreign Application Priority Data

Jan. 4, 2001 (DE) .......................................... 101 00 168

(51) Int. Cl.$^7$ .............................................. G06F 17/50
(52) U.S. Cl. .................................. 716/1; 716/17; 716/18
(58) Field of Search ........................................ 716/1–18

(56) References Cited

U.S. PATENT DOCUMENTS 5,572,437 A * 11/1996 Rostoker et al. ............ 716/18
5,926,396 A * 7/1999 Ohara ........................... 716/4
6,345,378 B1 * 2/2002 Joly et al. ...................... 716/2
6,457,157 B1 * 9/2002 Singh et al. ................... 716/2

FOREIGN PATENT DOCUMENTS

| EP | 1 016 992 A1 | 7/2000 |
| JP | 04 095 168 A | 3/1992 |
| JP | 04 205 566 A | 7/1992 |
| JP | 07 094 587 A | 4/1995 |

* cited by examiner

Primary Examiner—Matthew Smith
Assistant Examiner—Paul Dinh
(74) Attorney, Agent, or Firm—Laurence A. Greenberg; Werner H. Stemer; Gregory L. Mayback

(57) ABSTRACT

In a method for computer-aided design of a circuit, a hardware description code of the circuit is created using logical circuit blocks, each circuit block being allocated a supply voltage. The hardware description code is transformed into a net list that contains logical cells and their connections. A specific supply voltage is assigned to each cell by a unique identifier. Afterward, a time sequence analysis of the circuit is performed taking account of the identifiers of the cells.

8 Claims, 3 Drawing Sheets

METHOD FOR DESIGNING CIRCUITS WITH SECTIONS HAVING DIFFERENT SUPPLY VOLTAGES

BACKGROUND OF THE INVENTION

Field of the Invention

The invention relates to a method for the computer-aided design of a circuit that contains sections having different supply voltages.

As the scale of integration increases to an ever greater extent and the complexity of the circuits continuously increases, there is a continuous increase in the requirements made of the circuit configuration. Powerful and flexible design tools are required which, at the simulation level, can keep up with the advances in the area of integrated circuit fabrication. This applies both to the verification of the functionality of the circuit and to the accuracy of the prediction of signal time delays in data paths of the circuit.

The computer-aided development of circuits is based on a conceptual circuit concept and contains the steps of the writing-down of the circuit concept in a suitable hardware description language (e.g. VHDL), the analysis of the circuit concept under the aspect of logical functionality, the synthesis of a circuit design (creation of a synthesized net list), the re-analysis of the synthesized design (post-layout analysis) and the programming of a suitable chip fabrication apparatus. The overall process sequence is referred to as "design flow".

Difficulties arise if the design tools known heretofore are intended to be used to analyze circuits, which contain sections having different supply voltages. Such multivoltage circuit designs currently have to be analyzed with a high outlay of manual work. First, it is necessary to partition the overall design into sections having different supply voltages. Afterward, it is necessary, likewise by manual work, to insert so-called level shifters at the boundaries of the circuit sections having different supply voltages into the net list. After the creation of the net list, a further serious problem results from the fact that the different supply voltages have to be taken into account in the analysis of the temporal behavior of the designed circuit. This has not been possible heretofore or has only been possible to a very limited extent by so-called "derating".

SUMMARY OF THE INVENTION

It is accordingly an object of the invention to provide a method for designing circuits with sections having different supply voltages which overcome the above-mentioned disadvantages of the prior art methods of this general type, which significantly facilitates the computer-aided design of a circuit with sections having different supply voltages. In particular, the intention is to enable better automation of the synthesis step and more accurate analysis of the temporal behavior of the circuit.

With the foregoing and other objects in view there is provided, in accordance with the invention, a method for computer-aided design of a circuit having sections with different supply voltages. The method includes creating a hardware description code of the circuit using logical circuit blocks, allocating a supply voltage to each of the logical circuit blocks, and transforming the hardware description code into a net list containing logical cells and related connections. Each of the logical cells corresponds to a cell type to which is given a unique identifier of the supply voltage to which a logical cell is assigned. An analysis of the circuit is then carried out on a basis of the net list taking account of identifiers of the logical cells.

An essential aspect of the invention is that the logical cells defined in the net list are assigned an identifier that uniquely specifies the supply voltage for which the respective cell is intended to be used. This makes it possible to differentiate cells of identical logical functionality (i.e. of the same cell type) in the net list format, which results in that all further tools in the design sequence, depending on the identifier of the cell, can reference different physical parameters. This will be explained in more detail in connection with the time sequence analysis.

A level shifter cell is preferably incorporated into a connection between two cells with different identifiers.

An advantageous refinement of the invention is characterized in that a connection attribute is assigned to each input and to each output of a logical cell, which connection attribute, in the synthesis of the circuit design (i.e. the transformation of the hardware description code into a net list), has the effect that an output of a first cell can be (directly) connected to an input of a second cell only when the output of the first cell and the input of the second cell have identical connection attributes, and that the allocation of connection attributes for inputs and outputs is effected according to a predetermined assignment specification between the set of identifiers and the set of connection attributes. Therefore, a design rule is established which would be contravened in the case of connection of inputs and outputs with different connection attributes.

A preferred assignment specification consists in a specific identifier of a cell being assigned exactly one connection attribute that is assigned only to the specific identifier. What this achieves is that a direct connection (i.e. one realized without the interposition of a level shifter) between the signal path of adjacent cells is possible only when the cells are assigned to the same supply voltage. An alternative procedure consists in permitting, in specific cases, one and the same connection attribute to be assigned also to different identifiers. This case will be of importance when, with regard to the connection attributes, there is a demand for a differentiation capability that is less fine with regard to different supply voltages than for different identifiers. Since the connection attributes (of the inputs and outputs of the cells) are used in the context of the design synthesis, while the identifiers (of the cells) are used as a basis for the design analysis (and increase the accuracy thereof), this measure may be expedient in many cases.

The definition of connection attributes for inputs and outputs of cells makes it possible for the incorporation of level shifter cells between outputs and inputs with different connection attributes of adjacent cells to be effected automatically in the context of the computer-aided creation of the net list (circuit synthesis). The list significantly reduces the design complexity.

In accordance with an added mode of the invention, during the transforming step, there is performed the step of incorporating automatically a level shifter cell between the output of the first logical cell and the input of the second logical cell, provided that the connection attribute assigned to the output of the first logical cell is not identical to the connection attribute assigned to the input of the second logical cell.

A particularly preferred procedure in the design sequence is characterized in that the analysis step is a time sequence analysis of the circuit.

In this case, it is advantageous if the time sequence analysis contains a calculation step for determining signal transfer times within cells with different identifiers, and, for this purpose, identifier-dependent technology information items with respect to the cells are accessed, the technology information items being contained in a technology cell library. Therefore, it is possible to carry out a time sequence calculation for cells with different identifiers.

One possibility for continuing to perform the time sequence analysis with existing design tools—which are not specifically designed for the calculation of multivoltage circuits—consists in providing, after the choice of a reference voltage, a transformation of the identifier-dependent technology information items of the cells as a function of the reference voltage chosen, and then in carrying out the calculation step for cells with different identifiers using the transformed technology information items and the one reference voltage chosen.

In this connection, it is pointed out that the "identifier-based" form of the time analysis is superior to the known procedure of scaling the input-to-output transfer times by a "derating" factor. This is because "derating" presupposes that the change in the signal transfer time that occurs in the event of a change in the supply voltage can be described according to a predetermined relationship used for the analysis (simply a linear relationship is usually assumed). However, such a predetermined relationship yields—at least for a tenable parameterization complexity—a time/voltage behavior that corresponds to reality only in a narrow voltage range, e.g., in the case of linear derating, for instance for voltage fluctuations in the range of +/−3% from the desired value. Therefore, multivoltage designs cannot be analyzed satisfactorily in terms of their temporal behavior solely by derating.

In accordance with a further mode of the invention, there is the step of providing identifier-dependent derating parameters in the technology cell library.

In accordance with another mode of the invention, there is the step of calculating a transformed derating parameter of a cell Z according to an equation $k_n(Z)=(Ubas(Z)/Uref)*k(Z)$. Where Ubas is the supply voltage assigned to the cell, k(Z) is the transformed derating parameter of the cell Z for the supply voltage and Uref is the reference voltage.

Other features which are considered as characteristic for the invention are set forth in the appended claims.

Although the invention is illustrated and described herein as embodied in a method for designing circuits with sections having different supply voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
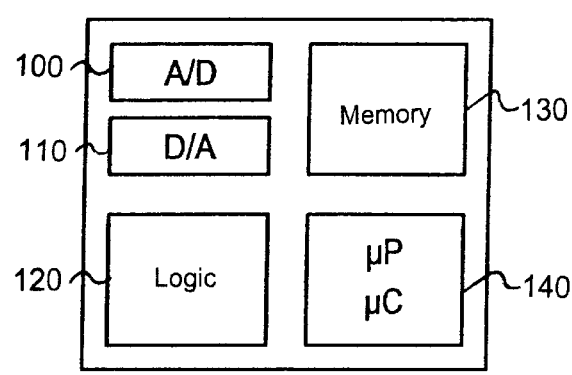
FIG. 1 is a block circuit diagram of a complex electrical circuit composed of different circuit parts according to the invention.

Referring now to the figures of the drawing in detail and first, particularly, to FIG. 1 thereof, there is shown an illustration of an electrical circuit which is realized as an integrated circuit (IC). The electrical circuit contains an A/D converter 100, a D/A converter 110, a logic unit 120, a memory 130 and also a microprocessor μP or microcontroller μC 140.

During the design of such an IC, the various circuit parts are coded in a suitable hardware description language and then analyzed or simulated in order to check the coded circuit design. By way of example, the hardware description language VHDL (Very High Speed Integrated Circuits Hardware Description Language) can be used for coding the logical and memory modules 120, 130. The microprocessor or the microcontroller 140 is usually described at the component level using C code routines that are provided for the simulation by an analog simulator, e.g. a simulator similar to simulation program with integrated circuit emphasis (SPICE).

The A/D converter 100 and the D/A converter 110 can be described both in VHDL and in SPICE routines.

A logic circuit section of the IC shown in FIG. 1 is considered below in FIG. 2. The illustration shows by way of example a data path DP that runs through a first circuit block SB1 and then a second circuit block SB2. Both circuit blocks SB1, SB2 contain, in a manner that is not illustrated, logic components such as, for example, logic gates and also e.g. flip-flops. Furthermore, they may also contain more complex control logic.

Figure 4:
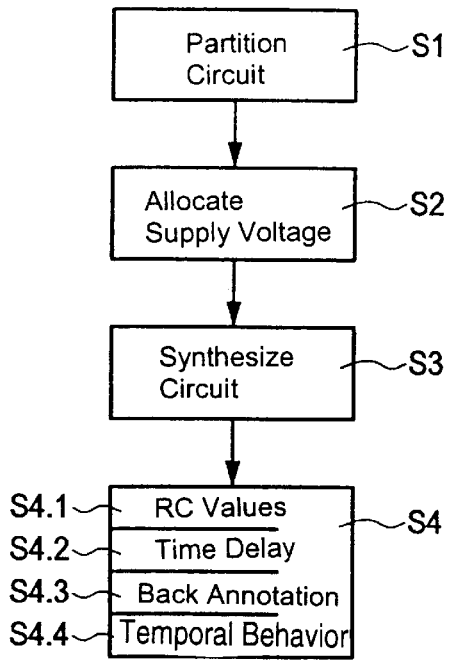
FIG. 4 is a flow diagram of a method according to the invention.

The procedure in the computer-aided design of a circuit is explained with reference to FIG. 4. In a first step S1, the circuit in FIG. 1 is partitioned under the aspect of the lowest possible power consumption. An optimization of the power consumption can be achieved when, as illustrated in FIG. 2, different circuit blocks are operated with different supply voltages. The saving effect consists in the fact that circuit blocks that still function entirely satisfactorily even at comparatively low supply voltages are not operated with an unnecessarily high supply voltage. The assessment of individual circuit blocks with regard to their power consumption can be effected e.g. with the aid of the design tool "Watt-Watcher". The circuit description is effected by a suitable hardware description language at the register transfer level (RTL).

Figure 2:
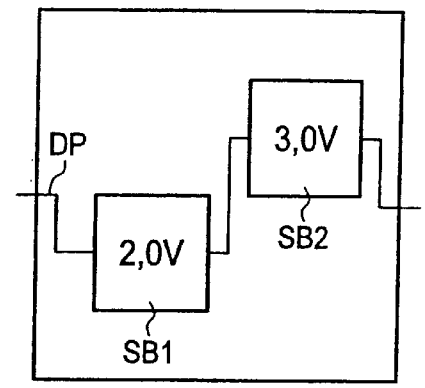
FIG. 2 is a block circuit diagram of a logic section of the circuit shown in FIG. 1, with two circuit sections that are operated with different supply voltages.

After the partitioning of the circuit layout in step S1, in step S2 each block is allocated a suitable supply voltage (see FIG. 2). In the context of the step S2, the functionality of the circuit is also checked at the RTL level. The RTL analysis serves for testing whether the designed circuit fulfils the logic specifications imposed on it.

The synthesis of the circuit is effected at the gate level in step S3. During the synthesis of the circuit, the latter is defined in the form of a net list. The net list contains a representation of the logic elements of the circuit, e.g. (N)AND and (N)OR gates, flip-flops, inverters or combined basic logic elements, and also a representation of all the connecting lines between these logic elements. The representation of a logic element of the net list is referred to as a logical cell and a connection between the logical cells is referred to as a node connection. The cells required in the net list are stored in technology cell libraries that are accessed in the synthesis step and in the subsequent steps. It is assumed below that a logical cell corresponds to a logic element of the actual circuit which is operated only by one supply voltage, i.e. a logical cell in the net list is always assigned to exactly one supply voltage in accordance with the previously effected partitioning of the circuit.

Figure 3:
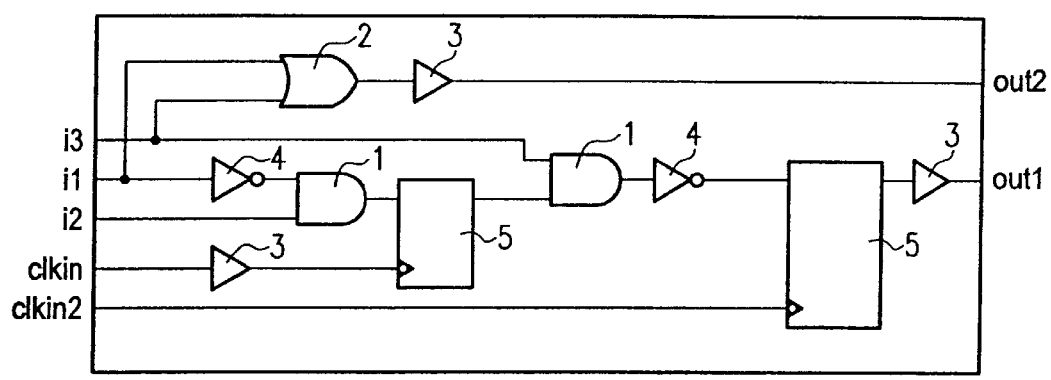
FIG. 3 is a circuit diagram of a logical cell.

FIG. 3 shows an exemplary illustration of a circuit section associated with a single supply voltage, e.g. one of the circuit blocks SB1 or SB2 illustrated in FIG. 2, or a partial region thereof, using the logical cells and node connections, i.e. in other words in the form of a net list. The net list contains the inputs i3, i2, i1, clkin, clkin2 and the outputs out1 and out2. The logical block illustrated in FIG. 3 contains, for its part, logical cells in the form of AND gates 1, an OR gate 2, drivers 3, inverting drivers 4 and flip-flops 5, which are clocked via the clock inputs clkin and clkin2. The node connections of the logical cells 1, 2, 3, 4, 5 are illustrated graphically in FIG. 3. The circuit block illustrated in FIG. 3 can also itself be considered as a logical cell ("macrocell").

According to the invention, each logical cell of the net list is assigned an identifier that specifies the supply voltage with which the (actual) logic element corresponding to the logical cell is associated. The corresponding definition was carried out in step S2, as already described.

A cell suffix can be used to identify the logical cells. A cell AND situated in a 2 volt (V) voltage environment is designated as AND__2v, for example, and a cell AND in a 3 V voltage environment is correspondingly denoted AND__3v. The identifier results in that cells in the net list format that are assigned to different supply voltages can be distinguished from one another. From now on, all subsequent design tools can have recourse to the identifier.

The identification of the logical cells e.g. by cell suffixes, results in that the technology cell libraries must be constructed accordingly, i.e. must support the identification. In this connection, it is pointed out that previous hardware description languages (such as, for example, Verilog) have no library management that would allow an identifier in the form described to be added to a logical cell.

In the example considered in FIG. 3, in which all the logical cells 1, 2, 3, 4, 5 are assigned the same supply voltage, the logical macrocell constructed from the logical cells is also assigned to a single supply voltage. The macrocell can therefore be designated in the same way as the individual logical cells by a (abitrarily chosen) name and a cell suffix.

In the net list, logical cells or logical macrocells assigned to different supply voltages are connected to one another.

For this purpose, it is necessary to insert level shifters between the corresponding outputs and inputs of the interconnected cells. The reason for this requirement is explained using an example.

A logic "1" produces a voltage level of 1 V at the output of a 1 V logic element of a circuit. If the voltage level is applied to the input of an e.g. 5 V logic element, an indeterminate input signal is present since the switching threshold of the 5 V logic element is about 1.0 V. In the opposite case, 5 V would be applied to the input of a 1 V logic element. This would destroy the 1 V logic element of the circuit.

Level shifters are incorporated at the design level in the net list format by the interposition of logical level shifter cells between logical cells having different supply voltages. The interposition is effected automatically in the design sequence on the basis of connection attributes that were assigned beforehand to all the inputs and outputs of the logical cells. Inputs and outputs with identical connection attributes are directly connected; a level shifter cell is inserted between inputs and outputs that have different connection attributes.

The allocation of connection attributes to the inputs and outputs of a cell is effected in a manner dependent on the cell suffix of the cell. A first possibility consists in each cell suffix being unambiguously assigned a connection attribute. The consequence of this is that a level shifter cell is always incorporated in each connection node between cells having different supply voltages. A second possibility consists in one and the same connection attribute being assigned to different cell suffixes at least for some of the cell suffixes. What can thereby be achieved is e.g. that cells whose supply voltages are not far apart from one another are synthesized without the interposition of level shifter cells.

Level shifter cells can also be incorporated, if appropriate, in the context of the so-called "place & root" functionality of the synthesis design tool. In the context of step S3, further checking and optimization of the circuit design can be affected with regard to its performance. In contrast to the initial assessment of the circuit layout carried out in step S1 under aspects of power consumption, this step is now affected on the basis of the net list, (i.e. at the gate level) and through targeted changes of identifiers or cell suffixes.

One example of a code in the synopsis lib format for the allocation of connection attributes ("connection_classes") reads as follows:

```
default_connection_class : "vdd" ;
cell (buffer)
    { pin (OUT)
        { ;
        ... }
    }
cell (nand)
    { pin (OUT)
        { ;
        ... }
    }
cell (or)
    { pin (IN)
        {
        ... }
    }
cell (low_voltage_cell_y)
    { pin (IN)
        {
        ... }
    }
```

In this case, the connection attribute "vdd" is assigned to all the inputs and outputs of the logical cells with the names "buffer", "nand", "or", "low_voltage_cell_y".

One example of the code of a level shifter cell reads as follows:

```
cell (vdd_y_to_vdd_x_shifter)
    { pin (OUT)
        { connection_class : "vdd_x" ;
        ... }
    }
    { pin (IN)
        { connection_class : "vdd_y" ;
        ... }
    }
```

The code defines a level shifter cell with the name "vdd_y_to_vdd_x_shifter", which connects output terminals with the connection attribute "vdd_x" to input terminals which are assigned to the connection attribute "vdd_y".

In step S4, the circuit design is analyzed with regard to its temporal behavior. A static analysis is usually performed. Step S4 can be broken down into four sub-steps.

The first sub-step S4.1 is referred to as an extraction step and consists in obtaining the RC values with respect to the individual cells automatically from the net list. For this purpose, recourse is had to the technology cell libraries and the cell information items stored therein.

In a second sub-step S4.2, a time delay calculation is carried out from the RC values obtained in the extraction step for all of the cells. The calculated time delays or signal transfer times are stored as timing arcs in a file of the .sdf format, usually referred to as an SDF file. For the calculation of the signal transfer times, recourse is made to information items from the technology cell library. For the calculation of the signal transfer times, a reference voltage Uref with regard to which the calculation is to be carried out must be communicated to the corresponding program routine.

A third sub-step S4.3 is usually referred to as "back-annotation". In this sub-step, a model is generated from the timing arcs calculated with respect to a cell and from the net list that is considered again, which model reproduces as well as possible both the logical behavior and the signal transfer times in the circuit object considered. The model is the basis for the further analysis in step S4.4.

The model calculation is based on an extract from the net list which is referred to as (logical) object. The logical object (and also the circuit object described by it) is assigned to one or more supply voltages, i.e. either a partial section (block) of the circuit or a plurality of blocks or the entire circuit may be involved, depending on the design task to be achieved. The logical object is uniquely defined by the logical cells that it encompasses and also the node connections of the cells.

The net list of the object to be modeled, information items from the technology cell library and information items with regard to the temporal behavior of the environment of the object to be modulated (e.g. clock generator, etc.) in the circuit are used as input quantities for the model calculation.

Logical cells having the same functionality but a different identifier (i.e. e.g. AND_v2 and AND_v3) are referred to as a cell type. In general terms, the technology cell library contains, for a given cell type, data which are characteristic of the cell type and, moreover, are also identifier-dependent at least in part. Therefore a first data record, which is assigned to a logical cell with a first identifier of the given cell type, differs at least in one data value from a second data record, which is assigned to a logical cell with a second identifier of the same cell type. However, this condition need not be satisfied for all cell types, since in the case of cell types of low sensitivity relative to a change in the supply voltage, it is also possible to impose less stringent requirements on the accuracy of the analysis.

Figure 6:
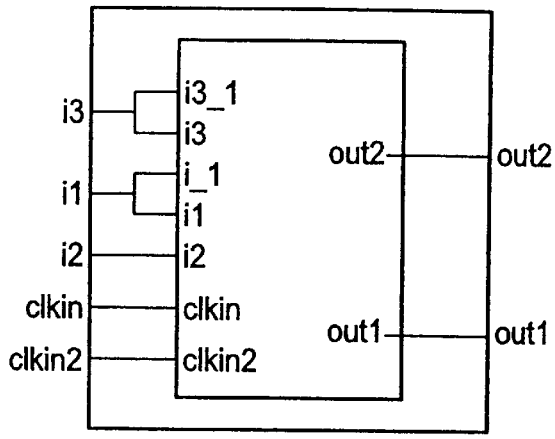
FIG. 6 is a block circuit diagram of a cell model that is obtained in a model calculation and is used as a basis for the analysis of the temporal behavior according to the invention.
Figure 7:
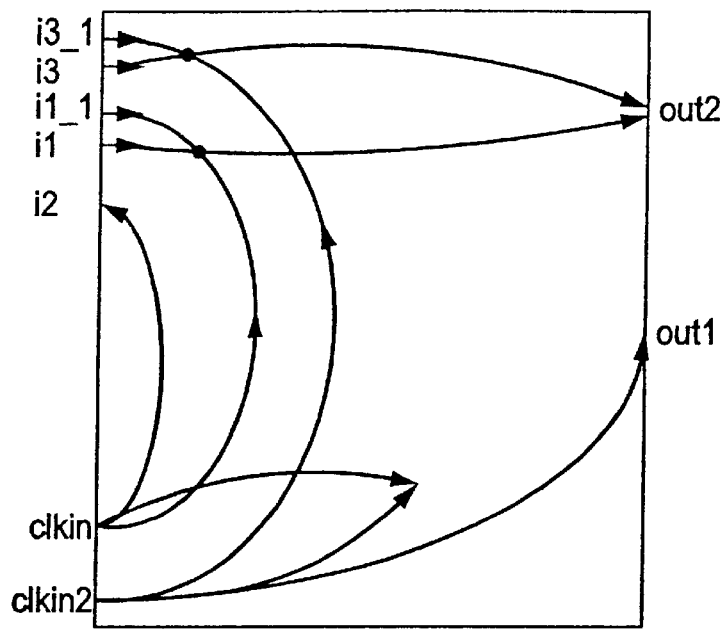
FIG. 7 is a graphical illustration of timing arcs of the model.

The purpose of creating models from the net list is that the later overall analysis of the circuit on the basis of the models instead of the corresponding net lists of the objects can be affected much more rapidly and more favorably in respect of complexity. FIG. 7 illustrates the timing arcs which were determined with regard to the calculation of the model for the signal transfer times between in each case two input terminals or input and output terminals. FIG. 6 shows a diagrammatic illustration of a net list of the model on which the extract from the net list shown in FIG. 3 is based.

In a fourth sub-step S4.4, the actual analysis of the temporal behavior (either statically or, if appropriate, dynamically in the context of an event simulation) of the entire circuit design is then effected.

The procedure for calculating signal transfer times (step S4.2) according to the prior art will be explained first.

Previous technology libraries contain exclusively parameter data that relate to a single, fixedly predetermined supply voltage. The latter is referred to as the basic voltage Ubas of the technology cell library considered. The transfer times for the corresponding input-to-output connections of the cell are then calculated from these data in step S4.2 using the extracted RC values. In step S4.2, the basic voltage Ubas is usually chosen as reference voltage Uref for the calculation.

If a circuit design contains cells or blocks at different voltages, it is inevitable that at least those cells or blocks that are assigned to a different voltage will be calculated incorrectly in terms of their temporal behavior.

A supply voltage that deviates from the basic voltage can be taken into account by derating corrections in previous design concepts. For this purpose, use is made of a so-called k factor, which is also referred to as a derating parameter. The k factor is likewise stored in the technology cell library considered, as a parameter for the cell considered (with respect to the basic voltage).

Figure 5:
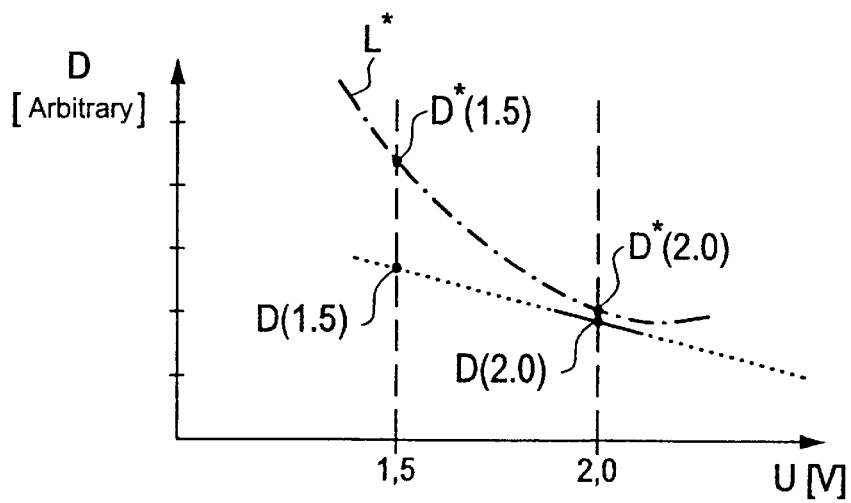
FIG. 5 is a graph for elucidating derating according to the prior art, which graph illustrates a signal transfer time from an input of a cell to an output of the cell as a function of the supply voltage.

FIG. 5 shows a graph for elucidating derating, which is known as such. In the graph, the signal transfer time D for an input-to-output connection of a logical cell is plotted against the supply voltage U. The transfer times that actually occur are designated by D*(1.5) for a supply voltage of 1.5 V and D*(2.0) for a supply voltage of 2.0 V. The dash-dotted line L* runs through the two points D*(1.5) and D*(2.0) and represents the temporal behavior of the actual circuit object.

In the example illustrated here, a basic voltage Ubas=2.0 V is used as a starting point. The delay time determined at 2.0 V is designated by D(2.0) in FIG. 5 and represents a good estimation for the transfer time D*(2.0) that actually occurs.

If, on the basis of a technology cell library with respect to the basic voltage 2.0 V, the intention is to calculate the time delay for a cell or a block at a supply voltage U—deviating therefrom—of e.g. 1.5 V, this is effected, in the case of derating, e.g. in accordance with the following relationship:

$$D(U)=Dbas \times [1+k \times (U-Ubas)].$$

In the calculation, the value for the supply voltage U is prescribed for Uref. In the above equation, Dbas designates the transfer time duration for the basic voltage Ubas, i.e. in this case Dbas=D(2.0). Dbas is referred to below as the characteristic time duration.

The k factor represents the gradient of the tangent to the curve L* at the basic voltage Ubas. As can be seen from FIG. 5, the transfer time D(1.5) calculated by derating in accordance with the above equation for a supply voltage of 1.5 V clearly deviates from the actual value D*(1.5).

Even if a higher-order polynomial with a plurality of k factors is used for the derating, the voltage range over which derating yields satisfactory results remains limited.

The construction of the modified technology cell library that is used as a basis for the procedure according to the invention is illustrated by the table below:

| Basic voltage Ubas [V] | Name of the cell | Technology parameters (temporal behavior) |
|---|---|---|
| 2.5 | AND_u | D(2.5), k(2.5), ... |
|  | OR_u | D'(2.5), k'(2.5), ... |
| 2.0 | AND | D, k, ... |
|  | OR: | D', k', ... |
| 1.5 | AND_d | D(1.5), k(1.5), ... |
|  | OR_d | D'(1.5), k'(1.5), ... |

The first column of the table relates to the basic voltage, the table including cells with regard to a plurality of basic voltages Ubas. The names (cell type and identifier) of the logical cells are listed in the second column of the table and the third column of the table relates to technology parameters with respect to the individual cells, only the characteristic time duration and the k factor for the corresponding logical cell being presented as representative of a set of technology parameters. The table illustrates the construction of the technology cell library according to the invention by way of example and in a partial manner.

With regard to the basic voltage of 2.0 V, the construction of the technology cell library corresponds to the construction of a conventional library based on this voltage. The derating parameter and the characteristic time duration for the cell AND are designated by k and D, respectively, and the derating parameter and the characteristic time duration for the cell OR are indicated by k' and D', respectively.

Furthermore, the table includes the cells AND_d, OR_d and AND_u, OR_u of the same cell type that are assigned to the basic voltages of 1.5 V and 2.5 V, respectively. The suffixes used for distinguishing the cells are u (for up) and d (for down). The cell AND_u is assigned the parameters D(2.5), k(2.5) and also further parameters that are not presented; the cell OR_u is assigned the parameters D'(2.5), k'(2.5) and also further parameters that are not presented, and so on.

The calculation of the signal transfer times on the basis of the technology cell library according to the invention is carried out as follows.

As already mentioned, in step S4.2 it is necessary to set a specific reference voltage Uref, with regard to which the timing arcs (i.e. the signal transfer times) are calculated. According to the invention, an arbitrary voltage value can be chosen only for Uref. The value chosen has no influence on the calculation result, provided that the below-described transformation or normalization of the technology cell library with respect to the reference voltage Uref is carried out beforehand and recourse is then had to the normalized technology parameters during the time calculation.

The normalization of the parameter data in the technology cell library with regard to the (arbitrarily chosen) reference voltage Uref is affected for the characteristic time duration and the derating parameter according to the now listed rules.

Figure 8:
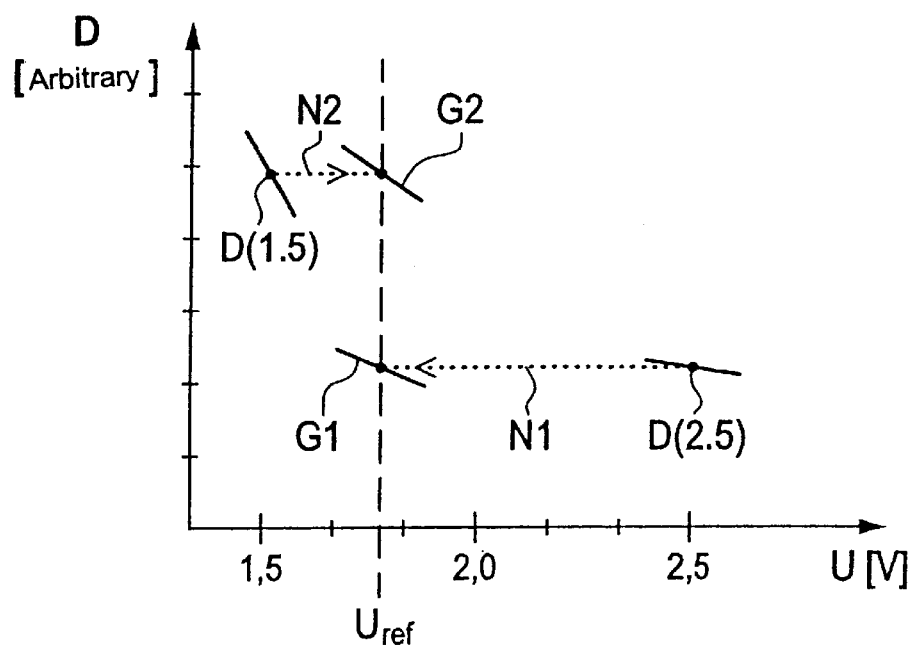
FIG. 8 is a graph for elucidating the calculation according to the invention of signal transfer times from an input to an output of a cell.

Normalized characteristic time duration Dn: in the normalized technology cell library, what is used as characteristic time duration Dn(Z) with respect to a cell Z considered (e.g. AND_u) is its corresponding technology parameter from the technology cell library (i.e. the value D(2.5) for AND_u). The corresponding normalization transformation is represented by the arrow N1 in FIG. 8. The arrow N2 analogously represents the normalization transformation for the cell AND_d.

Normalized derating parameter $k_n$: in the normalized technology cell library, the derating parameter $k_n(Z)$ of the cell Z is determined by the normalization transformation $$k_n(Z)=(Ubas(Z)/Uref) \times k(Z).$$

For Z=AND_U, the following results, for example: $k_n(AND\_u)=(2.5V/Uref) \times k(2.5)$. Accordingly, $k_n(Z)$ is dependent on the reference voltage Uref used in the normalization. $k_n(Z)$ is clearly described by the gradient of the straight lines—depicted in FIG. 8—G1 (for the cell AND_u) and G2 (for the cell AND_d).

The time calculation in step S4.2 is now carried out on the basis of the normalized technology parameters by prescribing the reference voltage Uref (which forms the basis for the normalization but is otherwise arbitrary). What is thereby achieved is that, for each cell, the correct technology parameters are used in the calculation in step S4.2, even though the tool used in step S4.2 enables, in a conventional manner, only a single circuit-uniform voltage Uref to be prescribed. In other words, what is achieved by the normalization of the technology cell library is that a multivoltage circuit design can be calculated using a conventional time analysis tool.

In accordance with the procedure outlined above in the analysis of the temporal behavior of a circuit design, the assignment—on which the invention is based—between cells and supply voltages, can also be utilized for the analysis of other physical quantities.

I claim:

1. A method for computer-aided design of a circuit having sections with different supply voltages, which comprises the steps of:

creating a hardware description code of the circuit using logical circuit blocks;

allocating a supply voltage to each of the logical circuit blocks;

transforming the hardware description code into a net list containing logical cells and related connections, each of the logical cells corresponding to a cell type to which is added a unique identifier of the supply voltage to which a logical cell is assigned;

assigning a connection attribute to each input and to each output of the logical cell;

during the transforming step, the output of a first logical cell to be connected to the input of a second logical cell only when the output of the first logical cell and the input of the second logical cell have identical connection attributes;

effecting an allocation of the connection attributes for inputs and outputs according to a predetermined assignment specification between a set of the identifiers and a set of the connection attributes; and carrying out an analysis of the circuit on a basis of the net list taking account of identifiers of the logical cells.

2. The method according to claim 1, which comprises incorporating a level shifter cell between two of the logical cells having different identifiers.

3. The method according to claim 1, which comprises assigning a specific identifier exactly one of the connection attributes which is assigned only to the specific identifier.

4. The method according to claim 1, which comprises assigning one and the same connection attribute to a plurality of different identifiers.

5. The method according to claim 1, which comprises during the transforming step, incorporating automatically a level shifter cell between the output of the first logical cell and the input of the second logical cell, provided that the connection attribute assigned to the output of the first logical cell is not identical to the connection attribute assigned to the input of the second logical cell.

6. A method for computer-aided design of a circuit having sections with different supply voltages, which comprises:

creating a hardware description code of the circuit using logical circuit blocks;

allocating a supply voltage to each of the logical circuit blocks;

transforming the hardware description code into a net list containing logical cells and related connections, each of the logical cells corresponding to a cell type to which is added a unique identifier of the supply voltage to which a logical cell is assigned;

carrying out an analysis of the circuit on a basis of the net list taking account of identifiers of the logical cells;

during the carrying out step, performing a calculation step for determining signal transfer times within the logical cells having different identifiers, and for this purpose, accessing identifier-dependent technology information items with respect to the logical cells, the information items being contained in a technology cell library;

choosing a reference voltage;

transforming the identifier-dependent technology information items of the logical cells as a function of the reference voltage chosen; and carrying out the calculation step for the logical cells with the different identifiers using transformed technology information items and the reference voltage chosen.

7. The method according to claim 6, which comprises providing identifier-dependent derating parameters in the technology cell library.

8. The method according to claim 6, which comprises calculating a transformed derating parameter of a cell Z according to an equation $k_n(Z)=(Ubas(Z)/Uref)*k(Z)$, where Ubas is the supply voltage assigned to the cell, $k(Z)$ is the transformed derating parameter of the cell Z for the supply voltage and Uref is the reference voltage.

* * * * *